Oct. 5, 1965 F. V. MARCINKO ETAL 3,210,459

HERMETIC SEAL FOR SEMICONDUCTOR DEVICES

Filed July 5, 1963

WITNESSES:

John G. Chopp

Raymond F. Majesko

INVENTORS
Frank V. Marcinko and
Robert J. Reintgen
BY
Frederick Shapoe
ATTORNEY

3,210,459
HERMETIC SEAL FOR SEMICONDUCTOR DEVICES

Frank V. Marcinko, Uniontown, and Robert J. Reintgen, Latrobe, Pa., assignors to Westinghouse Electric Corporation, Pittsburgh, Pa., a corporation of Pennsylvania Filed July 5, 1963, Ser. No. 292,938
3 Claims. (Cl. 174—52)

The present invention is concerned with improvements in or relating to semiconductor devices.

Heretofore in the fabrication of semiconductor devices comprising a cylindrical shell having a support at the lower end thereof on which a semiconductor member was mounted, a separate insulating member was employed to preclude the semiconductor member from shorting out against the cylindrical shell. Also, a separate insulating member, such as, a glass disk or washer was usually joined by soldering to the open end of the cylindrical shell to prevent shorting between an electrical conductor electrically contacting the semiconductor member and the upper extremity of the shell. The fabrication process for such devices usually involved making a ceramic sleeve or the like to envelop the semiconductor member and producing a suitable insulator usually a glass to hermetically seal the upper end of the shell and properly insulate the electrical conductor from the extremity of the shell.

Many problems were encountered in this respect since sufficiently strong glass to metal seals are not readily available and some provision had to be made to adapt the insulating glass so as to provide a good bond and air tight seal at the upper end of the cylindrical shell and provide the desired insulating properties. The above outlined techniques also proved to be costly and not suitably amenable to mass production.

An object of the present invention is to produce an improved semiconductor device by providing an integral electrical insulator and hermetic seal for a semiconductor member, which member is mounted on a support portion of a good electrically and thermally conductive cylindrical shell.

Another object of the invention is to provide a semiconductor device wherein a single insulating member is employed to electrically insulate both a semiconductor member and an electrical conductor joined to the member from the shell.

A still further object of the invention is to provide a hermetic package suitable for encapsulating a semiconductor member.

Other objects will in part, be obvious and will in part, appear hereinafter.

Figure 1:
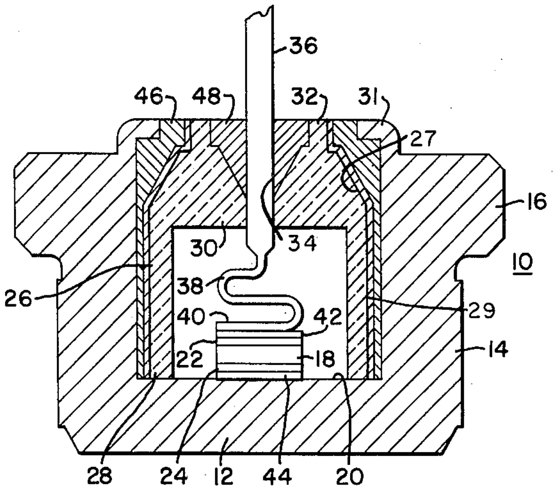
Figure 2:
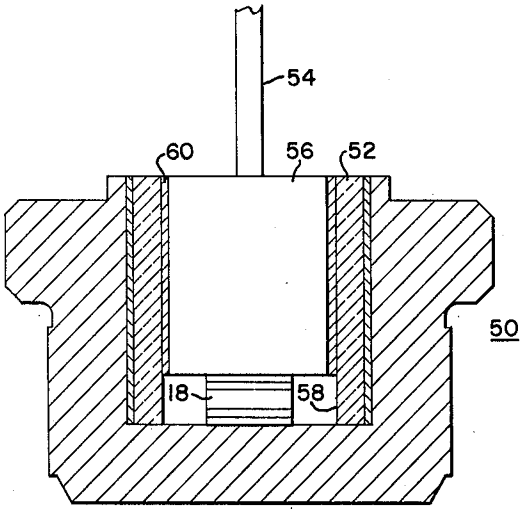

For a better understanding of the nature and objects of the invention, reference should be had to the following detailed description and drawing, in which:

FIG. 1 is an elevation view in cross section of the improved semiconductor device; and FIG. 2 is an elevation view, partly in cross-section for a modification of FIGURE 1.

In accordance with the present invention and in attainment of the foregoing objects, there is provided a semiconductor device comprising (1) a good electrically and thermally conductive support member which may comprise for example, a metal selected from the group consisting of copper, silver, aluminum, iron and base alloys thereof, (2) a semiconductor member engaged with the upper surface of the support by means of a soft solder, a compression contact, or equivalent means, and (3) cylindrical insulating member having at least one electrical conductor sealed in the upper end thereof and passing therethrough, the insulating member circumscribing the semiconductr member and the electrical conductor being in electrical contact therewith. The insulating member is preferably of an inverted cup-shaped geometry with at least one aperture in the closed end thereof for the conductor. Along the outer periphery of the support there projects from the upper surface thereof an upwardly extending cylindrical shell having an open end which may be integral therewith and in a preferred embodiment a peripheral flange at its upper extremity.

The cylindrical insulating member is disposed within the cylindrical shell and conforms to the inner circumference thereof. The insulating member may comprise, for example, a hard, impervious insulating ceramic or glass such as, steatite, alumina, cordierite and porcelain ceramics or lead and lead borate glasses. The insulating member preferably contains a metallic layer on certain portions of its outer surfaces so that it may be readily joined to the inner circumference of the cylindrical shell and thereby provide a strong bond and an air tight seal. The metallized layer may be applied by any method known to those skilled in the art, such as plating, dipping, silk screen methods, ultrasonics, evaporation, plasma jet spray, printing and painting. The metal layer may comprise any thermally conductive material which can be tinned or soldered, such as, copper, nickel, silver, tin, lead, gold, silver and base alloys thereof and the like.

Referring to FIG. 1 of the drawing, there is shown a semiconductor device 10 comprising a support 12 and an integral, upwardly extending, open ended cylindrical shell 14 having a peripheral flange 16 at its upper end. A semiconductor member 18 is mounted on the upper surface 20 of the support. The semiconductor member may contain a contact counterelectrode 22 and a contact electrode 24 on its upper and lower surfaces respectively as is shown in the drawing or the semiconductor member may be mounted directly on the support. Also, the semiconductor member may contain a single electrical contact on either the upper or lower surfaces thereof of a greater or lesser diameter than the semiconductor member. The semiconductor member may be engaged with the upper surface of the support by a solder material or a pressure contact. An inverted cup shaped insulating member 26 is disposed within the cylindrical shell and conforms closely to the inner circumference thereof, one end 28 of the insulating member being situated on the upper surface 20 of the support 12 and the other end 30 located at the open end of the shell.

In the embodiment shown in FIG. 1 of the drawing, the upper end 30 of the insulating member contains a circular projection 32. Within the circular projection 32, the insulating member contains an aperture 34 having an electrical conductor 36 sealed therein and passing therethrough. The electrical conductor 36 has a flattened S-curved segment 38 making contact to the upper surface of the counterelectrode 22 at the lowermost flat portion 40 of the curved segment. A solder preform 42 is disposed between the curved segment of the electrical conductor and the semiconductor member to facilitate joining. Similarly, another solder preform 44 may be disposed between contact electrode 24 and the upper surface 20 of the support to facilitate joining thereto.

It should be understood that it is not necessary that the conductor have a curved segment but such configuration is desired since the stresses placed upon a semiconductor member are more uniform. The electrical conductor may be plated particularly at the lower surface 40 of the curved segment in lieu of employing a solder preform between the curved segment and the semiconductor member.

The outer surfaces 27 of the inverted cup shaped insulating member 26 is metallized with a layer of metal 29 applied by for example, plasma jet spraying. A solder mass 46 and 48 is present between the metallized insulating member and the cylindrical shell and between the insulating member and the electrical conductor. A rolled flange 31 is formed about the inner periphery of the shell 14. The rolled flange 31 retains the relative cooperative relationship between the shell 14, the solder 46 and the inverted cup-shaped insulator member 26.

It should be understood that, while an inverted cup shaped insulating member of a particular design is shown in the figure, the upper surface of the member may be relatively flat or of another geometry depending on the design of the cylindrical shell.

In one suitable method for fabricating the device, the assembly with solder preforms is placed in a furnace containing an inert atmosphere and capable of maintaining a temperature of, for example, from 500° F. to 600° F., for a period of time whereby in a single heating cycle bonded soldered joints are formed between the support member and the contact electrode, the contact counter-electrode and the electrical conductor at the lower end of the curve segment and between the outer surfaces of the insulating member and the inner circumference of the cylindrical shell and a supporting joint is formed between the electrical conductor and the upper surface of the insulating member whereby a complete hermetic seal is effected.

Accordingly, it will be observed that in a single furnace operation a plurality of solder joints are produced and the semiconductor member is hermetically enclosed to form a semiconductor device. While a semiconductor diode is shown, control devices such as transistors and other three terminal semiconductor devices may be similarly produced.

Referring to FIG. 2, there is shown a modified semiconductor device 50. The device 50 is in all respects the same as the device 10 of FIG. 1 except that the insulating member 52 is open at both ends and the electrical conductor 54 has a large diameter segment 56 that conforms to the inner periphery 58 of the insulating member 52. The large diameter segment 56 is secured to the inner periphery 58 by a solder 60 or other suitable means.

The following example is illustrative of the practice of this invention:

*Example I*

A semiconductor device was assembled in accordance with the above procedure. The solders employed in bonding the semiconductor member to the support and to the electrical conductor and the insulating member to the cylindrical shell of the support was a 95% lead, 5% tin soft solder alloy with a melting point of about 590% F. The support member, cylindrical shell and electrical conductor were composed of copper. The insulating member was composed of a ceramic steatite and the semiconductor member was a wafer of silicon of a thickness of about 7 mils and an area of about 0.01 inch. The assembly was placed in a furnace and heated to a temperature of about 430° C. in an atmosphere of hydrogen for a period of the order of a few minutes. The device was then removed from the furnace, examined and tested. All of the joints formed were sound and continuous. Test results disclosed that the device was reliable and efficient and that the inverted cup shaped insulating member provided a good electrical insulator for the semiconductor member and concurrently provided a hermetic seal for the device.

Since certain changes in carrying out the above process in the product embodying the invention may be made without departing from its scope, it is intended that the accompanying description and drawing be interpreted as illustrative and not limiting.

We claim as our invention:

1. A semiconductor device comprising a good electrically and thermally conductive cylindrical shell having a support at the lower end thereof, a peripheral flange at the upper end thereof and a rolled flange formed about the inner periphery of the upper end thereof, a semiconductor member engaged with the upper surface of the support within the cylindrical shell, an inverted cup-shape insulating member having a circular projection on the upper end thereof and at least one electrical conductor sealed in the upper end thereof and passing therethrough, disposed in the shell and conforming to the inner circumference thereof, the insulating member being to the inner circumference of the shell joined thereto to provide a hermetic enclosure for the semiconductor member and the electrical conductor being in electrical contact with the semiconductor member.

2. A semiconductor device comprising a good electrically and thermally conductive cylindrical shell having a support at the lower end thereof, a semiconductor member engaged with the upper surface of the support within the cylindrical shell, a peripheral flange at the upper end thereof and a rolled flange formed about the inner periphery of the upper end thereof, an inverted cup shaped insulating member, having a circular projection on the upper end thereof and at least one electrical conductor sealed in the upper end thereof and passing therethrough, disposed in the shell and conforming to the inner circumference thereof, at least a portion of the outer surface of the insulating member having a metallic coating thereon, the insulating member being joined to the inner circumference of the shell at the metallically coated portions to provide a hermetic enclosure for the semiconductor member and the electrical conductor being in electrical contact with the semiconductor member.

3. A semiconductor device comprising a good electrically and thermally conductive cylindrical shell having a support at the lower end thereof, a peripheral flange at the upper end thereof, a semiconductor member engaged with the upper surface of the support within the cylindrical shell, an inverted cup shaped insulating member, having a circular projection on the upper end thereof and at least one electrical conductor sealed therein and passing therethrough, disposed in the shell and conforming to the inner circumference thereof, at least a portion of the outer surface of the insulating member having a metallic coating thereon, the insulating member being soldered to the inner circumference of the shell at the metallically coated portions to provide a hermetic enclosure for the semiconductor member and the electrical conductor being in electrical contact with the semiconductor member.

References Cited by the Examiner

UNITED STATES PATENTS

| | | | |
|---|---|---|---|
| 2,716,722 | 8/55 | Rothstein | 174—50 X |
| 3,110,080 | 11/63 | Boyer et al. | |

JOHN F. BURNS, *Primary Examiner.*

DARRELL L. CLAY, *Examiner.*